United States Patent
Tsuchiyama et al.

(10) Patent No.: US 9,434,865 B2
(45) Date of Patent: Sep. 6, 2016

(54) ADHESIVE COMPOSITION, AN ADHESIVE SHEET AND A PRODUCTION METHOD OF A SEMICONDUCTOR DEVICE

(71) Applicant: LINTEC Corporation, Tokyo (JP)

(72) Inventors: Sayaka Tsuchiyama, Tokyo (JP); Isao Ichikawa, Tokyo (JP)

(73) Assignee: LINTEC Corporation, Tokyo (JP)

( * ) Notice: Subject to any disclaimer, the term of this patent is extended or adjusted under 35 U.S.C. 154(b) by 0 days.

(21) Appl. No.: 13/832,170

(22) Filed: Mar. 15, 2013

(65) Prior Publication Data

US 2013/0244401 A1    Sep. 19, 2013

(30) Foreign Application Priority Data

Mar. 16, 2012    (JP) ................. 2012-061097

(51) Int. Cl.

| | |
|---|---|
| C09J 5/00 | (2006.01) |
| C09J 7/02 | (2006.01) |
| C09J 133/08 | (2006.01) |
| C09J 133/10 | (2006.01) |
| C09J 133/12 | (2006.01) |
| C09J 133/14 | (2006.01) |
| C09J 133/24 | (2006.01) |
| H01L 21/78 | (2006.01) |
| H01L 21/58 | (2006.01) |
| C09J 133/00 | (2006.01) |
| H01L 21/683 | (2006.01) |
| C09J 133/06 | (2006.01) |
| C09J 143/04 | (2006.01) |
| H01L 23/00 | (2006.01) |
| H01L 25/00 | (2006.01) |
| H01L 23/29 | (2006.01) |
| H01L 25/065 | (2006.01) |

(52) U.S. Cl.

CPC ............... *C09J 133/00* (2013.01); *C09J 5/00* (2013.01); *C09J 7/0203* (2013.01); *C09J 133/06* (2013.01); *C09J 133/066* (2013.01); *C09J 133/14* (2013.01); *C09J 133/24* (2013.01); *C09J 143/04* (2013.01); *H01L 21/6836* (2013.01); *H01L 21/78* (2013.01); *H01L 23/293* (2013.01); *H01L 24/29* (2013.01); *H01L 24/83* (2013.01); *H01L 24/92* (2013.01); *H01L 25/50* (2013.01); *H01L 24/27* (2013.01); *H01L 24/32* (2013.01); *H01L 24/48* (2013.01); *H01L 24/85* (2013.01); *H01L 24/94* (2013.01); *H01L 25/0657* (2013.01); *H01L 2221/6834* (2013.01); *H01L 2221/68327* (2013.01); *H01L 2221/68336* (2013.01); *H01L 2221/68377* (2013.01); *H01L 2221/68381* (2013.01); *H01L 2224/27003* (2013.01); *H01L 2224/27436* (2013.01); *H01L 2224/2929* (2013.01); *H01L 2224/2939* (2013.01); *H01L 2224/29387* (2013.01); *H01L 2224/32145* (2013.01); *H01L 2224/32225* (2013.01); *H01L 2224/32245* (2013.01); *H01L 2224/48227* (2013.01); *H01L 2224/83* (2013.01); *H01L 2224/83048* (2013.01); *H01L 2224/8385* (2013.01); *H01L 2224/83191* (2013.01); *H01L 2224/83203* (2013.01); *H01L 2224/83862* (2013.01); *H01L 2224/83907* (2013.01); *H01L 2224/92* (2013.01); *H01L 2224/92247* (2013.01); *H01L 2224/94* (2013.01); *H01L 2924/00014* (2013.01); *H01L 2924/12042* (2013.01); *H01L 2924/181* (2013.01); *Y10T 428/2826* (2015.01)

(58) Field of Classification Search

None

See application file for complete search history.

(56) References Cited

U.S. PATENT DOCUMENTS

| | | | |
|---|---|---|---|
| 8,703,585 B2 * | 4/2014 | Ichikawa ............ | H01L 21/6836 257/E21.516 |
| 2007/0276079 A1 * | 11/2007 | Saiki et al. .................... | 524/493 |
| 2008/0124839 A1 * | 5/2008 | Saiki et al. .................... | 438/113 |
| 2008/0241713 A1 * | 10/2008 | Tanaka .............................. | 430/7 |
| 2011/0159713 A1 | 6/2011 | Sato | |
| 2012/0196404 A1 * | 8/2012 | Ichikawa et al. ............. | 438/118 |
| 2013/0244402 A1 | 9/2013 | Tsuchiyama et al. | |

FOREIGN PATENT DOCUMENTS

| | | | |
|---|---|---|---|
| JP | 2007077321 | A | 3/2007 |
| JP | 2008133330 | A | 6/2008 |
| JP | 2009167244 | A | 7/2009 |
| JP | 2010106244 | A | 5/2010 |

OTHER PUBLICATIONS

English abstract of JP2008133330 (A).
English Abstract of JP 20091672440, Jul. 30, 2009.
English Abstract of JP 2007077321, Mar. 29, 2007.
English Abstract of JP 2010106244., May 13, 2010.

* cited by examiner

*Primary Examiner* — Robert Sellers

(74) *Attorney, Agent, or Firm* — Cahn & Samuels, LLP

(57) ABSTRACT

An adhesive composition includes an acrylic polymer (A), a heat curable resin (B) having unsaturated hydrocarbon group, and a coupling agent (C) having reactive a double bond group.

9 Claims, No Drawings

ADHESIVE COMPOSITION, AN ADHESIVE SHEET AND A PRODUCTION METHOD OF A SEMICONDUCTOR DEVICE

This patent application claims priority of Japanese patent document 2012-061097, filed on Mar. 16, 2012 in Japan, the entirety of which is incorporated herein by reference.

TECHNICAL FIELD

The present invention relates to an adhesive composition particularly suitable to be used during the step of dicing a silicon wafer or so, and adhering (die bonding) an obtained semiconductor chip to an organic circuit board or a lead frame or to other semiconductor chip, and also relates to an adhesive sheet comprising the adhesive layer consisting of said adhesive composition, and further relates to a production method of the semiconductor device using said adhesive sheet.

BACKGROUND OF INVENTION

The semiconductor wafer of silicon and gallium arsenic or so is produced in a large diameter, and this wafer is cut and separated (dicing) into small pieces of the element (the semiconductor chip), then moves on to the mounting step which is the subsequent step. At this time, the semiconductor wafer is adhered on the adhesive sheet in advance and the steps of dicing, washing, drying, expanding, and pickup are carried out respectively, then it is moves on to the bonding step which is the subsequent step.

Among these steps, in order to simplify the processes of the pickup step and the bonding step, various dicing die bonding adhesive sheets which comprises both of the wafer fixing function and the die adhesive function are proposed (refer to the patent article 1). The adhesive sheet disclosed in the patent article 1 enables the so-called direct die bonding, and allows omitting the coating step of the die adhering adhesive agent. This adhesive agent includes acrylic polymer, unsaturated hydrocarbon group containing epoxy resin, and heat curing agent; and if needed, a coupling agent such as silane coupling agent may be included.

The property required against the recent semiconductor device is extremely severe. For example, in regards with the connection of the electrical parts, the surface mounting method (reflow) wherein the entire package is exposed to a high temperature which is higher than the melting point of the soldering is being carried out. Further, recently, due to the transition to the soldering which does not include lead, the mounting temperature has increased to 260° C. or so. Therefore, the stress generated inside the semiconductor package during the mounting has become larger than before, hence the chances of causing problems such as peel or package crack at the adhesive boundary have increased. Thus, in said patent article 1, as for epoxy resin, the unsaturated hydrocarbon group containing epoxy resin is used, to improve the compatibility between the acrylic polymer and the epoxy resin, thereby adhesive reliability is improved.

Also, for the high density mounting, the package structure in which the chips are multiply stacked is proposed. In this package structure, not only the connection between the circuit board and the chip, but also the adhering between the chip and the chip is necessary. In the multistacked package, the chip is stacked on the chip via the adhesive layer and after curing the adhesive layer, the wire bonding is carried out, then further the stacking of the chip, curing of the adhesive layer, the wire bonding are carried out one after another, thereby the chips are stacked. However, in this method, as the curing of the adhesive layer is carried out each time the chip is stacked, hence when the number of the stacked chips increases, the production steps increases, therefore the improvement of the production efficiency is in demand.

Thus, it is being examined to simultaneously cure the adhesive layer by using the long time exposure to a high temperature at the mold sealing step after all the chips are stacked after carrying out the stacking and the wire bonding while the adhesive layer is before cured or semi-cured and without carrying out the curing of the adhesive agent at the stacking of the chip. By applying such simultaneous curing, the process to carry out the curing of each adhesive layer can be omitted; thereby the productivity can be improved. However, when applying such production method, the adhesive layer is before curing or semi-cured during the wire bonding. Therefore, the chip vibrates or displaced during the wire bonding, thus particularly when the chips are stacked against each other, the adhesiveness between the chips are lowered and may cause problem to the wire bonding. In order to improve the adhesiveness between the chips, it is thought to be effective to blend the coupling agent to the adhesive layer.
[Patent Article 1] JP Patent Application Laid Open No 2008-133330

However, it is not necessarily easy to uniformly mix the coupling agent in the adhesive agent. If the dispersibility of the coupling agent in the adhesive agent is not good, the adhesive force cannot be stabilized, thus the variability of the products becomes large.

Further, even when the process to carry out simultaneous curing of the adhesive layer as mentioned in the above is employed, a high temperature of 150° C. or higher is necessary during the wire bonding; thus in some case the adhesive layer was partially cured. In case of such undesirable curing, the pressure is not applied, hence when the adhesive layer is cured; the adhesive force is simply lost which leads to lowering of the adhesive strength. When the adhesive layer is partially cured, the following property to the rough surface is lost particularly, and the adhesiveness against the circuit board surface or die pad having relatively large roughness declines significantly. Therefore, in regards with the production of the multistacked package, in order to carry out the adhesion between the circuit board and the chip securely, it was necessary to use the adhesive agent different from that of used for the adhesion between the chips; or to carry out the adhesion curing between the chip and the circuit board separately from the above mentioned simultaneous curing; which was thought as the cause of the lowering of the productivity.

Therefore, the object of the present invention is to provide an adhesive composition, and an adhesive sheet having an adhesive layer comprising said adhesive composition, and production method of a semiconductor device using said adhesive sheet; capable of uniformly mixing the coupling agent in the adhesive layer, capable of stably carrying out wire bonding before the simultaneous curing even when the process of carrying out simultaneous curing of the adhesive layer is applied when producing the multistacked package, and exhibiting an excellent adhesive strength after the curing; further particularly capable of accomplishing high packaging reliability in the semiconductor device.

SUMMARY OF INVENTION

The present invention which solves the above mentioned problems include the followings.

(1) An adhesive composition comprising an acrylic polymer (A), a heat curable resin (B) having unsaturated hydrocarbon group, and a coupling agent (C) having reactive double bond group.
(2) The adhesive composition as set forth in (1) wherein said coupling agent (C) is a silane coupling agent comprising the reactive double bond.
(3) The adhesive composition as set forth in (1) or (2) comprising a filler (G).
(4) A single layer adhesive film comprising the adhesive composition as set forth in any one of (1) to (3).
(5) An adhesive sheet wherein an adhesive layer comprising the adhesive composition as set forth in any one of (1) to (3) is formed on a support.
(6) The adhesive sheet as set forth in (5) wherein said support is a resin film.
(7) The adhesive sheet as set forth in (5) wherein said support is a dicing sheet.
(8) A production method of a semiconductor device comprising the steps of;

laminating the adhesive layer of the adhesive sheet as set forth in any one of (5) to (7) to a semiconductor wafer, dicing said semiconductor wafer and the adhesive layer, thereby obtaining a semiconductor chip, releasing the semiconductor chip from the support while the adhesive layer is transferred to said semiconductor chip, and adhering said semiconductor chip on a die pad portion or on other semiconductor chip via said adhesive layer.

According to the present invention, the coupling agent can be uniformly mixed in the adhesive layer, and while it is before cured or semi-cured, the chips or the chip and the circuit board are adhered against each other. Therefore, even in case the process of simultaneously curing the adhesive layer when producing the multistacked package, the wire bonding can be carried out stably; furthermore the semiconductor chip can be bonded to other semiconductor chip or the circuit board in an excellent adhesive strength; thereby the semiconductor device showing high package reliability can be obtained even under a harsh condition.

DETAILED DESCRIPTION OF INVENTION

Hereinafter, the adhesive composition, the adhesive sheet and the production method of the semiconductor device using said sheet will be explained in further detail.
(The Adhesive Composition)

The adhesive composition according to the present invention includes an acrylic polymer (A) (hereinafter it may be referred as "(A) component" as same as other components), a heat curable resin (B), a coupling agent (C) as essential components; and in order to improve various physical properties, other components may be included depending on the needs. Hereinafter, these components will be explained in detail.
(A) Acrylic Polymer As the acrylic polymer (A), conventionally known acrylic polymers can be used. The weight average molecular weight (Mw) of the acrylic polymer (A) is preferably 10000 to 2000000, and more preferably 100000 to 1500000. If the weight average molecular weight of the acrylic polymer (A) is too low, the adhesive force between the adhesive layer and the support becomes too high, thus the pickup malfunction of the chip may occur. If the weight average molecular weight of the acrylic polymer (A) is too large, the adhesive layer may not be able to follow the roughness of the adherend which may become the cause of the void. The weight average molecular weight of the acrylic polymer (A) is the value in terms of polystyrene measured by gel permeation chromatography (GPC) method.

The glass transition temperature (Tg) of the acrylic polymer (A) is preferably −60 to 70° C., and more preferably −30 to 50° C. If Tg of the acrylic polymer (A) is too low, the releasing force of the adhesive layer and the support becomes large, thus the pickup malfunction of the chip may take place. If Tg of the acrylic polymer (A) is too high, the adhesive force to fix the wafer may become insufficient.

As the monomer constituting the acrylic polymer (A), for example (meth)acrylate and the derivative thereof may be mentioned. Specifically, (meth)acrylic alkyl ester having alkyl group of carbon atoms of 1 to 18 such as (meth)acrylic methyl, (meth)acrylic ethyl, (meth)acrylic propyl, (meth)acrylic butyl; (meth)acrylate having cyclic back bone such as (meth)acrylic cyclo alkyl ester, (meth)acrylic benzyl ester, isobornyl(meth)acrylate, dicyclo pentanyl(meth)acrylate, dicyclopentenyl(meth)acrylate, dicyclopentenyloxyethyl(meth)acrylate, imide(meth)acrylate; hydroxyl group containing (meth)acrylate such as hydroxyl methyl(meth)acrylate, 2-hydroxyethyl(meth)acrylate, 2-hydroxy propyl (meth)acrylate; glycidyl acrylate, glycidyl methacrylate may be mentioned. Also, acrylic acid, methacrylic acid, itaconic acid may be used. These may be used alone or it may be used by combining two or more.

Among these, as the monomer constituting the acrylic polymer (A), as the acrylic polymer has good compatibility between the heat curable resin (B) which will be explained in the following, thus at least the hydroxyl group containing (meth)acrylate is used preferably. In such case, in the acrylic polymer (A), the constituting unit derived from the hydroxyl group containing (meth)acrylate is preferably included in the range of 1 to 20 wt %, and more preferably in the range of 3 to 15 wt %. As the acrylic polymer (A), specifically, copolymer between (meth)acrylic alkyl ester and the hydroxyl group containing (meth)acrylate is preferable.

Also, together with the above mentioned (meth)acrylate and the derivative thereof, vinyl acetate and acrylo nitrile or so may be used as the material of the acrylic polymer (A) within the range which does not interfere the object of the present invention.

The acrylic polymer (A) is preferably included in the ratio of 50 wt % or more in the entire weight of the adhesive composition. By having such constitution, it becomes to have preferable property when used for the process of simultaneous curing of the adhesive layer. This is because, when the adhesive layer of before curing is exposed to the high temperature, it can maintain certain degree of hardness and the wire bonding can be carried out. That is, if the content of the acrylic polymer (A) in the adhesive composition is relatively large, even if it is before the heat curing, the storage elasticity of the adhesive layer can be maintained high. Therefore, even if the adhesive layer is before cured or semi-cured, the vibration and the displacement or so of the chip during the wire bonding can be suppressed, and thereby the wire bonding can be carried out stably. As such, if the content of the acrylic polymer (A) is increased in order to secure the process suitability, the amount of the heat curable resin (B) decreases relatively. Therefore, the curing may be insufficient; however the adhesive composition of the present invention is capable of bonding the heat curable resin (B) and the coupling agent having the reactive double bond via the reactive double bond; thus the insufficient curing can be solved. The acrylic polymer (A) is preferably included in the ratio of 50 to 90 wt %, and more preferably 50 to 80 wt % in the entire weight of the adhesive composition.

(B) The Heat Curable Resin Comprising the Unsaturated Hydrocarbon Group

The heat curable resin (B) comprises the epoxy resin and the heat curing agent; and in the present invention, either one or the both of the epoxy resin or the heat curing agent comprises the unsaturated hydrocarbon group. As for the epoxy resin, there are the epoxy resin (B1) comprising the unsaturated hydrocarbon group and the epoxy resin (B1') which does not comprise the unsaturated hydrocarbon group; and as the heat curing agent, there are the heat curing agent (B2) comprising the unsaturated hydrocarbon and the heat curing agent (B2') which does not comprise the unsaturated hydrocarbon group. In the heat curable resin (B) of the present invention, either one of the epoxy resin (B1) comprising the unsaturated hydrocarbon group or the heat curing agent (B2) comprising the unsaturated hydrocarbon group is included as the essential component. Also, either one of the epoxy resin (B1) and epoxy resin (B1') is included as the essential component; and either one of the heat curing agent (B2) or the heat curing agent (B2') is included as the essential component. Note that, if both of the epoxy resin and the heat curing agent do not comprise the unsaturated hydrocarbon group, the combination only of the component (B1') and the component (B2') is excluded.

As the heat curable resin (B) comprises the unsaturated hydrocarbon group, it has high compatibility with the acrylic polymer (A) and the following described coupling agent (C) compared to the heat curable resin which does not comprises the unsaturated hydrocarbon group. Therefore, the adhesive composition of the present invention has improved reliability than the adhesive composition only including the heat curable resin only which does not comprise the unsaturated hydrocarbon group as the heat curable resin.

The unsaturated hydrocarbon group is the unsaturated group comprising the polimerizability; and as specific examples, vinyl group, allyl group, acryloyl group, methacryloyl group, acrylamide group, methacrylamide group or so may be mentioned, and preferably acryloyl group may be mentioned. Therefore, the unsaturated group of the present invention does not refer to the double bond without polymerizability. For example, in the component (B), the aromatic ring may be included; however the unsaturated structure of the aromatic ring does not refer to the unsaturated hydrocarbon group of the present invention.

As for the epoxy resin (B1) comprising the unsaturated hydrocarbon group, since the strength of the adhesive after the heat curing and the heat resistance are improved; preferably the resin comprises the aromatic ring. Also, as the epoxy resin (B1) comprising the unsaturated hydrocarbon group, for example the compound wherein a part of the epoxy group of the polyvalent epoxy resin is converted to the group including the unsaturated hydrocarbon group may be mentioned. Such compound can be produced by carrying out the addition reaction of the acrylic acid to the epoxy resin. Alternatively, the compound wherein the group including the unsaturated hydrocarbon group directly bonded to the aromatic ring or so constituting the epoxy resin may be mentioned.

Here, as the epoxy resin (B1) comprising the unsaturated hydrocarbon group, the compound shown in the following formula (1), the compound shown in the following formula (2), or the compound obtained by carrying out the addition reaction of the acrylic acid to a part of the epoxy group of the epoxy resin (B1') which does not comprise the unsaturated hydrocarbon group which will be described in the below, or so may be mentioned.

[Chemical formula 1]

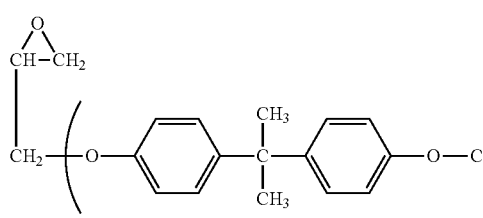 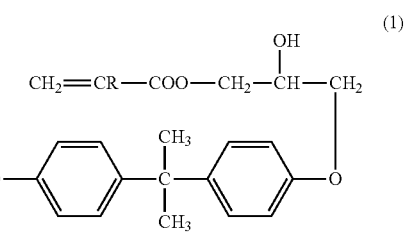

(1)

(R is H— or $CH_3$—; n is an integer of 0 to 10.)

[Chemical formula 2]

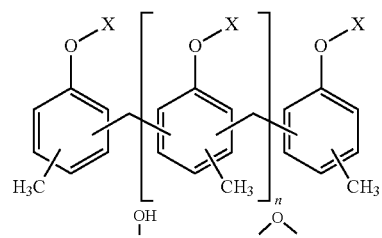

(2)

(R is H— or $CH_3$—, n is an integer of 0 to 10.)

Note that, the epoxy resin (B1) comprising the unsaturated hydrocarbon group obtained by the reaction between the epoxy resin (B1') which does not comprise the unsaturated hydrocarbon group and the acrylic acid may be the mixture between the unreacted material or the compound in which the epoxy group is completely consumed; however in the present invention, it only needs to be that substantially including the above mentioned compound.

As for the epoxy resin (B1') which does not comprise the unsaturated hydrocarbon group, the conventionally known epoxy resin can be used. As such epoxy resin, specifically, polyvalent epoxy resin or the epoxy compound comprising two or more functional groups in the molecule such as biphenyl compound, bisphenol A diglycidyl ether or the hydrogenates thereof, cresol novolac epoxy resin, dicyclopentadiene epoxy resin, biphenyl epoxy resin, bisphenol A epoxy resin, bisphenol F epoxy resin, phenylene backbone epoxy resin or so may be mentioned. These may be used alone or by combining two or more thereof.

The number average molecular weight of the epoxy resin (B1) and (B1') is not particularly limited; and from the point of the curability of the adhesive layer, the strength after the curing or the heat resistance, it is preferably 300 to 30000, more preferably 400 to 10000, and particularly preferably 500 to 3000. Also, the content of the unsaturated group in the entire amount of the epoxy resin [(B1)+(B1')] is 0.1 to 1000 mol, preferably 1 to 500 mol and more preferably 10 to 400 mol with respect to 100 mol of the epoxy group in entire amount of the epoxy resin. If it is 0.1 mol or less, there may be no effect of the improvement of the package reliability, and if it is 1000 mol or more then the heat curability may be insufficient.

The heat curing agent function as the curing agent against the epoxy resin (B1) and (B1'), and in the present invention, the heat curing agent (B2) comprising the unsaturated hydrocarbon group and the heat curing agent (B2') which does not comprise the unsaturated hydrocarbon group are used. In case the epoxy resin consist only from the epoxy resin (B1') which does not comprise the unsaturated hydrocarbon, the heat curing agent (B2) comprising the unsaturated hydrocarbon is used as the essential component. In case the epoxy resin comprising the unsaturated hydrocarbon group is used, either one of the heat curing agent (B2) or the heat curing agent (B2') may be used.

The heat curing agent (B2) comprising the unsaturated hydrocarbon comprises the polymerizable unsaturated hydrocarbon group; and preferably vinyl group, allyl group, acryloyl group, methacryloyl group, acrylamide group, methacrylamide group or so may be mentioned; and more preferably methacryloyl group and acrylamide group are included. Also, further preferably, addition to these, the functional group capable of reacting with the epoxy group is included. As the functional group capable of reacting with the epoxy group, preferably phenolic hydroxyl group, alcoholic hydroxyl group, amino group, carboxyl group and acid unhydrides or so may be mentioned; and among these, more preferably phenolic hydroxyl group, alcoholic hydroxyl group and amino group may be mentioned, particularly preferably phenolic hydroxyl group may be mentioned.

As for the heat curing agent (B2) comprising the unsaturated hydrocarbon, for example, the compound wherein a part of the hydroxyl group of the phenol resin being substituted by the group including the unsaturated hydrocarbon group, or the compound wherein the group including the unsaturated hydrocarbon group is directly bonded with the aromatic ring of the phenol resin or so may be mentioned. Here, as the phenol resin, the novolac phenol resin shown in the following formula (chemical formula 3), dicyclopentadiene phenol resin shown by (chemical formula 4), and the polyvalent phenol resin shown by (chemical formula 5) may be mentioned; and particularly novolac phenol resin is preferable. Therefore, as the heat curing agent (B2) comprising the unsaturated hydrocarbon group, for example, the compound wherein a part of the hydroxyl group of the novolac phenol resin being substituted by the group including the unsaturated hydrocarbon group, or the compound wherein the group including the unsaturated hydrocarbon group is directly bonded with the aromatic ring of the novolac phenol resin or so may be mentioned.

[Chemical formula 3]

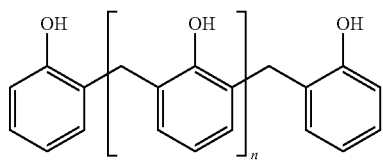

[Chemical formula 4]

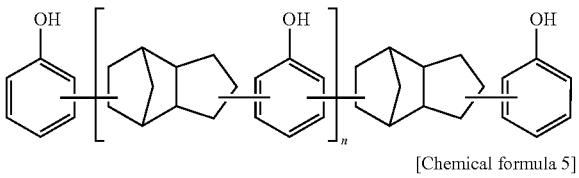

[Chemical formula 5]

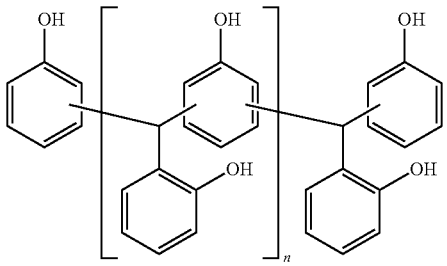

As particularly preferable example of the heat curing agent (B2) comprising the unsaturated hydrocarbon group, the structure wherein the unsaturated hydrocarbon group is introduced in a part of the repeating unit comprising the phenol hydroxyl group as such as the following formula (a), and the compound including the repeating unit comprising the group including the unsaturated hydrocarbon group such as the following formula (b) or (c) may be mentioned. Particularly preferable heat curing agent (B2) comprising the unsaturated hydrocarbon group includes the repeating unit of the following formula (a) and the following formula (b) or (c).

[Chemical formula 6]

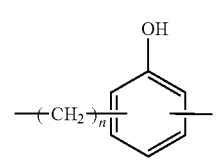

(a)

(In the formula, $n$ is 0 or 1.)

[Chemical formula 7]

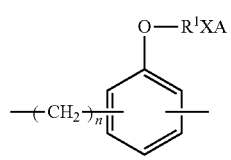

(b)

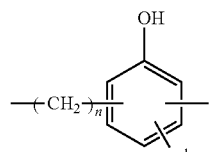

(c)

(In the formula, n is 0 or 1, $R^1$ is hydrocarbon group having the carbon atoms of 1 to 5 which may comprise the hydroxyl group, X is —O— or —NR$^2$— (R$^2$ is hydrogen or methyl), or R$^1$X is single bond and A is acryloyl group or methacryloyl group).

The phenolic hydroxyl group represented by repeating unit (a) is a functional group capable of reacting with the epoxy group, and functions as the curing agent which cures by reacting with the epoxy group of the epoxy resin during the heat curing of the adhesive composition. Also, the unsaturated hydrocarbon group represented by the repeating unit (b) and (c) polymerizes and cures during the energy ray curing of the adhesive composition, and has the effect to lower the adhesive force between the adhesive layer and the support. Also, the unsaturated hydrocarbon group represented by the repeating unit of (b) and (c) improves the compatibility between the acrylic polymer (A) and the heat curable resin (B). As a result, the cured product of the adhesive composition becomes further strong and thereby the reliability as the adhesive agent improves. The ratio of the repeating unit shown by said formula (a) in this heat curing agent (B2) is 5 to 95 mol %, more preferably 20 to 90 mol % and particularly preferably 40 to 80 mol %; and the ratio of the repeating unit shown by said formula (b) or (c) is, in total, 5 to 95 mol %, more preferably 10 to 80 mol %, and particularly preferably 20 to 60 mol %.

As the heat curing agent (B2') which does not comprise the unsaturated hydrocarbon group, the compound comprising two or more functional groups capable of reacting with the epoxy resin in one molecule may be mentioned. As the functional group thereof, the phenolic hydroxyl group, alcoholic hydroxyl group, amino group, carboxyl group and acid unhydride or so may be mentioned. Among these, preferably, the phenolic hydroxyl group, amino group, acid unhydride or so may be mentioned, and more preferably phenolic hydroxyl group, amino group or so may be mentioned. Further preferably, phenolic hydroxyl group, amino group may be mentioned.

As the specific examples of the phenolic curing agent, polyvalent phenol resin, biphenol, novolac phenol resin, dicyclopentadiene phenol resin, aralkyl phenol resin or so may be mentioned. As the specific examples of the amine curing agent, DICY (dicyandiamide) may be mentioned. These may be used alone or two or more may be combined.

The number average molecular weight of the above mentioned heat curing agent (B2) and (B2') is preferably 300 to 30000, more preferably 400 to 10000, and particularly preferably 500 to 3000.

The content of the heat curing agent [(B2) and (B2')] in the adhesive agent composition is preferably 0.1 to 500 parts by weight, and more preferably 1 to 200 parts by weight with respect to 100 parts by weight of the epoxy resin [(B1) and (B1')]. If the content of the heat curing agent is too small, the adhesiveness may not be obtained due to the insufficient curing, and if it is too much, the moisture absorbing rate of the adhesive layer increases thus the package reliability may be lowered. Also, the content of the heat curing agent [(B2) and (B2')] is preferably 5 to 50 parts by weight, and more preferably 10 to 40 parts by weight with respect to 100 parts by weight of the acrylic polymer (A). If the content of the heat curing agent is too small, the adhesiveness may not be obtained due to the insufficient curing, and if it is too much, the moisture absorbing rate of the adhesive layer increases thus the package reliability may be lowered.

In the adhesive composition, the heat curable resin (B) (the total of the epoxy resin and the heat curing agent) is included preferably by 1 to 1500 parts by weight and more preferably 3 to 1200 parts by weight with respect to 100 parts by weight of the acrylic polymer (A). If the content of the heat curing resin (B) is less than 1 parts by weight, sufficient adhesiveness may not be obtained, and if it exceeds 1500 parts by weight the releasing force between the adhesive layer and the support becomes high, thereby the pickup malfunction may occur.

(C) The Coupling Agent Comprising the Reactive Double Bond

The coupling agent (C) comprising the reactive double bond group is not particularly limited as long as it has the reactive double bond. The reactive double bond is preferably vinyl group, allyl group, styryl group or (meth)acryl group which are reactive.

The coupling agent comprising the reactive double bond group, for example, a coupling agent comprising the vinyl group, a coupling agent comprising the styryl group, a coupling agent comprising (meth)acryloxy group or so are used suitably. The above mentioned coupling agent is preferably a silane coupling agent from the point of the compatibility between the acrylic resin.

As the specific examples of the above mentioned coupling agent, vinyltrimethoxy silane, vinyltriethoxy silane, p-styryltrimethoxy silane, 3-methacryloxypropyldimethoxy silane, 3-methacryloxypropyltrimethoxy silane, 3-methacryloxypropyltriethoxy silane, 3-methacryloxypropylmethyldiethoxy silane, and 3-acryloxypropyltrimethoxy silane or so may be mentioned. As the commercially available product of these, for example, KBM-1003, KBE-1003, KBM-1403, KBM-502 and KBM-503, KBE-502, KBE-503, KBM-5103 may be mentioned (all of the above mentioned are made by Shin-Etsu Co., Ltd.).

The above mentioned coupling agent is preferably included in the range of 0.001 to 10 parts by weight, more preferably 0.005 to 10 parts by weight, and particularly preferably 0.01 to 5 parts by weight, with respect to the total 100 parts by weight of the acrylic polymer (A) and the heat curable resin (B). If the amount of the above mentioned coupling agent is too much, the coupling agent evaporates when the adhesive composition is heated which may cause to generate the void. On the other hand, when the amount of the coupling agent is too less, the effect of the addition of the coupling agent may not be exhibited sufficiently.

When the adhesive agent comprises the coupling agent (C) in such range, even if the adhesive layer is before cured or semi-cured, the adhesiveness between the chips or the chip and the circuit board is high, and it can withstand the vibration during the wire bonding. Therefore, the wire bonding can be carried out stably without the chip being vibrating, displaced during the wire bonding.

Other Components

The adhesive composition can include the following components in addition to the above mentioned components.

(D) The Photopolymerization Initiator

The adhesive composition preferably comprises the photopolymerization initiator. By comprising the photopolymerization initiator, for example, when the adhesive sheet of the present invention is used as the dicing die bonding sheet, after laminating on the wafer, by irradiating the ultraviolet ray before the dicing step, the coupling agent comprising the reactive double bond and the unsaturated hydrocarbon group comprised in the heat curable resin are reacted, thereby the pre-curing can be carried out. By carrying out the pre-curing, the adhesive layer before the curing is relatively softened thus the adhesiveness to the wafer is good, and during the dicing, it has suitable hardness thus other problems such as the adhering of the adhesive layer to the dicing blade or so can be prevented. Also, the adhesiveness at the interface of the adhesive layer and the support (the resin film or the dicing tape) can be controlled. Further, as it becomes harder at the pre-cured status than the before cured; thus the stability during the wire bonding is improved.

As the specific example of the photopolymerization initiator (D), benzophenone, acetophenone, benzoin, benzoin methylether, benzoin ethylether, benzoin isopropylether, benzoin isobutylether, benzoin benzoate, benzoin methyl benzoate, benzoin dimethylketal, 2,4-diethylthioxanthone, α-hydroxycyclohexylphenylketone, benzyldiphenylsulphide, tetramethylthiuram monosulphide, azobisbutyronitrile, benzyl, dibenzyl, diacetyl, 1,2-diphenylmethane, 2-hydroxy-2-methyl-1-[4-(1-methylvinyl)phenyl]propanone, 2,4,6-trimethylbenzoyldiphenylphosphineoxide, and β-chloroanthraquinone or so may be mentioned. The photopolymerization initiator (D) may be used alone or by combining two or more thereof.

When using the photopolymerization initiator (D), the blending ratio thereof may be determined suitably based on the total amount of the reactive double bond group comprised in said coupling agent (C), and the unsaturated hydrocarbon group comprised in the heat curable resin (B) and the energy ray polymerizable compound (H) which will be described in the following. Although it is not particularly limited, for example, it is usually 0.1 to 10 parts by weight, preferably 1 to 5 parts by weight with respect to 100 parts by weight of total of the heat curable resin (B), the coupling agent (C) and the energy ray polymerizable compound (H). When the content of the photopolymerization initiator (D) is less than the above mentioned range, a sufficient reaction may not be obtained due to insufficient photopolymerization; and if it exceeds the above range, the residue which does not contribute to the photopolymerization will be generated, and thus the curing of the adhesive composition may be insufficient.

(E) The Curing Accelerator

The curing accelerator (E) is used to regulate the curing speed of the adhesive composition. As the preferable curing accelerator, tertiary amines such as triethylenediamine, benzyldimethylamine, triethanolamine, dimethylamino ethanol, tris(dimethylaminomethyl)phenol or so; imidazoles such as 2-methylimidazole, 2-phenylimidazole, 2-phenyl-4-methylimidazole, 2-phenyl-4,5-dihydroxymethylimidazole, 2-phenyl-4-methyl-5-hydroxymethylimidazole or so; organic phosphines such as tributylphosphine, diphenylphosphine, triphenylphosphine or so; tetraphenylborate such as tetraphenylphosphoniumtetraphenylborate, triphenylphosphinetetraphenylborate or so may be mentioned. These may be used alone or by combining two or more thereof.

In case of using the curing accelerator (E), it is preferably included by the amount of 0.01 to 10 parts by weight, more preferably 0.1 to 1 parts by weight with respect to 100 parts by weight of total of the heat curable resin (B). By comprising the curing accelerator (E) in the amount of the above mentioned range, even if it is exposed under high temperature high humidity, an excellent adhesiveness can be exhibited, and also even if it is exposed to a harsh reflow condition, high package reliability can be attained. If the content of the curing accelerator (E) is too small, a sufficient adhesive characteristic cannot be obtained due to the insufficient curing, and if it is too much, the curing accelerator having high polarity moves in the adhesive layer towards the adhesive boundary side at high temperature high humidified condition, and segregates thereby lowers the package reliability.

(F) The Crosslinking Agent

In the adhesive composition, in order to regulate the initial adhesive force and the cohesion force of the adhesive layer, the crosslinking agent (F) can be added. Note that, when blending the crosslinking agent, said acrylic polymer (A) includes the functional group which reacts with the crosslinking agent. As for the crosslinking agent (F), organic polyvalent isocyanate compound, organic polyvalent imine compound or so may be mentioned.

As for the above mentioned organic polyvalent isocyanate compound, the aromatic polyvalent isocyanate compound, aliphatic polyvalent isocyanate compound, alicyclic polyvalent isocanate compound and the trimer of these organic polyvalent isocyanate compound, and end terminal isocyanate urethane prepolymer or so obtained by reacting these organic polyvalent isocyanate compound and polyol compound can be mentioned.

As for the organic polyvalent isocyanate compound, for example, 2,4-tolylenediisocyanate, 2,6-tolylenediisocyanate, 1,3-xylylenediisocyanate, 1,4-xylylenediisocyanate, diphenylmethane-4,4'-diisocyanate, diphenylmethane-2,4'-diisocyanate, 3-methyldiphenylmethanediisocyanate, hexamethylenediisocyanate, isophoronediisocyanate, dicyclohexylmethane-4,4'-diisocyanate, dicyclohexylmethane-2,4'-diisocyanate, trimethylolpropane adduct tolylenediisocyanate and lysine isocyanate or so may be mentioned.

In case of using the isocyanate crosslinking agent, as for the acrylic polymer (A), it is preferable to use the hydroxyl group containing polymer. If the crosslinking agent comprises the isocyanate group and the acrylic polymer (A) comprises the hydroxyl group, the reaction between the acrylic polymer (A) and the isocyanate group may take place, thereby the crosslinking structure can be easily introduced into the adhesive agent.

As for the above mentioned organic polyvalent imine compound, N,N'-diphenylmethane-4,4'-bis(1-aziridinecarboxyamide), trimethylolpropane-β-aziridinylpropionate, tetramethylolmethane-tri-β-aziridinylpropionate, and N,N'-toluene-2,4-bis(1-aziridinecarboxyamide)triethylene melamine or so may be mentioned.

In case of using the crosslinking agent (F), the crosslinking agent (F) is used in the ratio of usually 0.01 to 20 parts by weight, preferably of 0.1 to 10 parts by weight, more preferably of 0.5 to 5 parts by weight with respect to 100 parts by weight of the acrylic polymer (A).

(G) The Filler

In the adhesive composition, before curing, in order to regulate the hardness of the adhesive layer during the semi-cured condition and after the curing, the filler may be included. The filler may be either one of so called inorganic filler or organic filler; however from the point of the heat resistance, the inorganic filler is preferably used.

As the material of the filler, silica, alumina, calcium carbonate, calcium silicate, magnesium hydroxide, aluminum hydroxide, titanium oxide, carbon black, talc, mica, or clay or so may be mentioned. Among these, silica is preferable.

The average particle diameter of the above filler is preferably within the range of 0.005 to 2 μm. When the average particle diameter of the above mentioned filler is within said preferable range, the adhesiveness can be exhibited without damaging the laminating property between the semiconductor wafers. Note that, the above mentioned "average particle diameter" refers to the volume average particle diameter measured by the laser diffraction scattering method.

The above filler is preferably included in the range of 5 to 100 parts by weight with respect to 100 parts by weight of the total of the acrylic polymer (A) and the heat curable resin (B). If the amount of the above filler is too much, the adhesiveness to the wafer or the circuit board may be deteriorated. If the amount of the above mentioned filler particle is too less, the effect of adding the filler may not be sufficiently exhibited.

By comprising the filler (G) in the adhesive layer within the range of the above mentioned, the adhesive layer show the elasticity which can withstand the vibration of the wire bonding even before curing or semi-cured condition. Therefore, the chip does not vibrate or displaced during the wire bonding hence the wire bonding can be carried out stably.

(H) The Energy Ray Polymerizable Compound

In the adhesive composition, the energy ray polymerizable compound may be blended. The energy ray polymerizable compound (H) includes the energy ray polymerizable group; and polymerizes and cures when the energy ray such as ultraviolet ray, electron beam or so are irradiated. As such energy ray polymerizable compound (H), specifically, acrylate compounds such as trimethylolpropanetriacrylate, pentaerythritoltriacrylate, pentaerythritoltetraacrylate, dipentaerythritolmonohydroxypentaacrylate, dipentaerythritolhexaacrylate or 1,4-butyleneglycoldiacrylate, 1,6-hexanedioldiacrylate, polyethyleneglycoldiacrylate, oligoesteracrylate, urethaneacrylate oligomer, epoxy modified acrylate, polyetheracrylate and itaconic oligomer or so may be mentioned. Such compound preferably comprises at least one polymerizable double bond in the molecule and usually the weight average molecular weight is 100 to 30000, and preferably 300 to 10000 or so. In case of using the energy ray polymerizable compound (H), the blending amount thereof is, although it is not particularly limited, used in the ratio preferably of 1 to 50 parts by weight or so with respect to 100 parts by weight of the entire amount of the sold portion of the adhesive composition.

(I) The Thermoplastic Resin

In the adhesive composition, the thermoplastic resin (I) may be used. The thermoplastic resin (I) is blended in order to maintain the flexibility of the adhesive layer after the curing. As for the thermoplastic resin (I), it is preferable to have the weight average molecular weight of 1000 to 100000, and more preferably 3000 to 80000. By comprising the thermoplastic resin (I), the layer releasing between the support and the adhesive layer can be carried out easily during the pickup step of the semiconductor chip, and further the adhesive layer follows the roughness of the circuit board and enables to suppress the generation of the voids or so.

The glass transition temperature of the thermoplastic resin (I) is preferably with in the range of −30 to 150° C., and more preferably of −20 to 120° C. If the glass transition temperature of the thermoplastic resin (I) is too low, the releasing force between the adhesive layer and the support increases which causes the pickup malfunction of the chip; and if the glass transition temperature is too high, the adhesive force for fixing the wafer may become insufficient.

As for the thermoplastic resin (I), polyester resin, urethane resin, phenoxy resin, polybutene, polybutadiene, polystyrene or so may be mentioned. These may be used alone or by combining two or more thereof.

In case of using the thermoplastic resin (I), the blending amount thereof is preferably within the range of 1 to 300 parts by weight, more preferably 2 to 100 parts by weight with respect to 100 parts by weight of total of the acrylic polymer (A) and the heat curable resin (B). If the content of the thermoplastic resin (I) is within this range, the above mentioned effect can be obtained.

(J) Other Coupling Agent

Also, in the adhesive composition, in addition to said coupling agent (C), the coupling agent which does not comprise the reactive double bond may be blended. As for such coupling agent (J), the silane coupling agent which does not comprise the reactive double bond may be mentioned, and specifically, γ-glycidoxypropyltrimethoxy silane, γ-glycidoxypropylmethyldiethoxy silane, β-(3,4-epoxycyclohexyl)ethyltrimethoxy silane, γ-aminopropyltrimethoxy silane, N-6-(aminoethyl)-γ-aminopropyltrimethoxy silane, N-6-(aminoethyl)-γ-aminopropylmethyldiethoxy silane, N-phenyl-γ-aminopropyltrimethoxy silane, γ-ureidopropyltriethoxy silane, γ-melcaptopropyltrimethoxy silane, γ-melcaptopropylmethyldimethoxy silane, bis(3-triethoxysilylpropyl)tetrasulfan, methyltrimethoxy silane, methyltriethoxy silane, imidazole silane or so may be mentioned. These may be used alone or by combining two or more thereof.

(K) The General Additives

In the adhesive composition, other than the above mentioned, various additives may be blended if needed. As for such various additives, plasticizers, antistatic agents, antioxidants, pigments, colorings, gettering agents or so may be mentioned.

(The Adhesive Sheet)

The adhesive layer comprising the adhesive composition comprising each component of the above mentioned comprise the pressure sensitive adhesiveness and the heat curable property; and at the condition of before curing, it can be laminated by lightly pressing against the adherend. Also, in the adhesive layer, the coupling agent (C) is dispersed uniformly, thus the chips or the chip and the circuit board adheres against each other. Therefore, even in case the process of simultaneous curing the adhesive layer when producing the multistacked package, the wire bonding can be carried out stably, and furthermore, the semiconductor chip can be bonded to other semiconductor chip or to the circuit board in an excellent adhesive strength. Also, even under a harsh condition, the semiconductor device showing high package reliability can be obtained. In case the photopolymerization initiator (D) is included, it comprises the energy ray curable property, and the pre-curing can be carried out by irradiating the energy ray before the thorough curing. Due to the pre-curing, the hardness of the adhesive layer increases, and the stability during the wire bonding improves.

The adhesive sheet may be an adhesive film of the single layer wherein the above mentioned adhesive composition is made into a film; however preferably it is the adhesive sheet wherein the adhesive layer comprising the above mentioned adhesive composition is formed on the support in a releasable manner.

Hereinafter, by using the adhesive sheet wherein the adhesive layer is formed in the support in a releasable manner as an example, the preferable embodiment and the used embodiment will be explained. Upon using the adhesive sheet wherein the adhesive layer is formed on the support in a releasable manner; the adhesive layer is adhered to the adherend such as wafer or chip or so, and the adhesive layer is transferred to the adherend by releasing the support. The shape of the adhesive sheet according to the present invention can be any shape such as tape shape or so. The adhesive sheet may be a resin film which does not comprise the tack on the surface, or it may be so called the dicing sheet.

As the resin film used as the support of the adhesive sheet, for example, a transparent film such as polyethylene film, polypropylene film, polybutene film, polybutadiene film, polymethylpentene film, polyvinyl chloride film, vinylchloride copolymer film, polyethylenetelephthalate film, polyethylenenaphthalate film, polybutylenetelephthalate film, polyurethane film, ethylene vinylacetate copolymer film, ionomer resin film, ethylene(meth)acrylic acid copolymer film, ethylene(meth)acrylic ester copolymer film, polystyrene film, polycarbonate film, polyimide film, fluororesin film or so may be used. Also, the crosslinked film thereof may be used. Further, it may be a stacked film thereof. Also, the colored film thereof and the non-transparent film or so can be used as well.

The adhesive sheet according to the present invention is laminated to various adherend, then after the predetermined process is carried out to the adherend, the adhesive layer is released from the support while being adhered to the adherend. That is, the adhesive layer is used for the process including the step transferring to the adherend from the support. Therefore, the surface tension of the face contacting with the adhesive layer of the support (the resin film) is preferably 40 mN/m or less, more preferably 37 mN/m or less, and particularly preferably 35 mN/m or less. The lower limit is usually 25 mN/m or so. The resin film having such low surface tension can be obtained by suitably selecting the material, or it can be obtained by carrying out the release treatment by coating the releasing agent to the surface of the resin film.

As for the releasing agent used for the release treatment of the resin film, alkyds, silicones, fluorines, unsaturated polyesters, polyolefins, waxes or so may be used; however the releasing agent of alkyds, silicones, fluorines are particularly preferable as they comprises the heat resistance.

In order to carry out the release treatment to the surface of the resin film by using the above mentioned releasing agent, the releasing agent is used as it is without solvent, by diluting with solvent or by emulsified and coated using the gravure coater, mayer bar coater, air knife coater, roll coater or so; then cured under room temperature, or heat applying or electron beam curing, and the stacked body can be formed by wet lamination, dry lamination, thermofusion lamination, melt extrusion lamination, coextrusion processing or so.

The support may be a dicing sheet. The dicing sheet comprises the pressure sensitive adhesive layer on the resin film such as described in the above, and on the pressure sensitive adhesive layer, said adhesive layer is stacked in a releasable manner. Therefore, the pressure sensitive adhesive layer of the dicing sheet can be constituted from the known pressure sensitive adhesive agent having releasable property; and the pressure sensitive adhesive agent of ultraviolet ray curable type, heat foaming type, water swelling type, and weak adhesive type can be selected; thereby the releasing of the adhesive layer can be made easy.

Also, the adhesive sheet may have a shape of which the support and the adhesive layer are cut out as the same shape as the adherend (the semiconductor wafer or so) in advance. Particularly, the stacked body consisting of the support and the adhesive layer preferably has the embodiment being maintained on the lengthy releasing film.

The thickness of the support is usually 10 to 500 μm, preferably 15 to 300 μm, and particularly preferably 20 to 250 μm or so. Also, the thickness of the adhesive layer is usually 2 to 500 μm, preferably 6 to 300 μm, and particularly preferably 10 to 150 μm or so.

The production method of the adhesive sheet is not particularly limited, and in case the support is the resin film, the adhesive composition is pasted and dried on the resin film to form the adhesive layer; thereby it may be produced. Also, the adhesive sheet may be produced by providing the adhesive layer on other releasing film, and transferring this to above mentioned resin film or dicing sheet.

Note that, before using the adhesive sheet, in order to protect the adhesive layer, the releasing film may be stacked on the upper face of the adhesive layer. As the releasing film, those of which the releasing agent such as silicone resin or so are coated on the plastic material such as polyethylenetelephthalate film or polypropylene or so is used. Also, at the outer peripheral part of the surface of the adhesive sheet, additional agglutinant layer or the agglutinant tape may be provided in order to fix other jigs such as ring flame or so.

Next, in regards with the method of use of the adhesive sheet according to the present invention, it will be explained taking the case of using the adhesive sheet to the production of the semiconductor device as an example.

(The Production Method of the Semiconductor Device)

The production method of the semiconductor device according to the present invention comprises the steps of; laminating the adhesive layer of the adhesive sheet to a semiconductor film, dicing said semiconductor wafer and the adhesive layer, thereby obtaining a semiconductor chip, releasing the semiconductor chip from the support while the adhesive layer is adhered to said semiconductor chip, and adhering said semiconductor chip on a die pad portion or on other semiconductor chip via said adhesive layer.

Hereinafter, the production method of the semiconductor device according to the present invention will be described. In the production method of the semiconductor device according to the present invention, first, the semiconductor wafer is prepared wherein the circuit is formed on the frontside and the backside has been ground.

The semiconductor wafer can be silicon wafer, or it may be a compound semiconductor wafer such as gallium arsenic. The circuit is formed in the wafer frontside by various methods including the conventionally widely used method such as an etching method, a lift off method or so. Next, the opposite side (backside) of the circuit face of semiconductor wafer is ground. The grinding method is not particularly limited, and it may be ground by known means such as grinder or so. When carrying out the backside grinding, in order to protect the circuit on the frontside, the pressure sensitive adhesive sheet so called frontside protection sheet is laminated to the circuit surface. The backside grinding is carried out by fixing the circuit face side of the wafer (that is the frontside protection sheet side) to the chuck table or so, and then the backside which is not formed with the circuit is ground. The thickness after the wafer grinding is not particularly limited, however usually it is 20 to 500 μm or so.

Next, the ring frame and the backside of the semiconductor wafer are placed on the adhesive layer of the adhesive sheet according to the present invention, and then lightly pressed; thereby the semiconductor wafer is fixed. Next, in case the photopolymerization initiator (D) is blended to the adhesive layer, the energy ray is irradiated to the adhesive layer from the support side, and the reactive double bond group comprised in the coupling agent (C) and the unsaturated hydrocarbon group comprised in the heat curable resin (B) are reacted and cured; thereby the cohesion force of the adhesive layer is increased and the adhesive force between the adhesive layer and the support is made low. As for the energy ray being irradiated, the ultraviolet ray (UV), or the electron beam (EB) or so may be mentioned; and preferably the ultraviolet ray is used. Next, by using the cutting means such as the dicing saw or so, the above mentioned semiconductor wafer is cut and the semiconductor chip is obtained. The depth of the cut is determined considering the total of the thickness of the semiconductor wafer and the thickness of the adhesive layer, and also the abrasion of the dicing saw; and the adhesive layer is also cut as the same size as the chip. Note that, the energy ray irradiation may be carried out any time between after the semiconductor wafer is laminated and before the semiconductor chip is released (pickup); and for example, it may be carried out after the dicing and it may be carried out after the following described expanding step. Further, the energy ray irradiation can be carried out in plurality of times.

Next, if needed, by carrying out the expanding of the adhesive sheet, the space between the semiconductor chips is made wider; thereby the pickup of the semiconductor chip can be carried out easily. At this time, the adhesive layer and the support slides against each other and the adhesive force between the adhesive layer and the support declines, thereby the pickup property of the semiconductor chip improves. By carrying out the pickup of the semiconductor chip as such, the semiconductor chip can be released from the support while the adhesive layer being cut is adhered on the backside of the semiconductor chip.

Next, the semiconductor chip is placed on the surface of the die pad of the lead frame or on other semiconductor chip (lower chip) which is the chip mounting part. The chip mounting part is heated before the semiconductor chip is placed thereon or immediately after the semiconductor chip is placed thereon; and the chip is temporary adhered. The heating temperature is usually 80 to 200° C., preferably 100 to 180° C.; and the heating time is usually 0.1 seconds to 5 minutes, and preferably 0.5 seconds to 3 minutes. The pressure when placing the chip is usually 1 kPa to 200 MPa.

It is preferable to stack the chip sequentially while the chip is temporary adhered, and carry out the thorough curing of the adhesive layer by using the heating of the resin sealing which is usually carried out during the package production. By going through such steps, the adhesive layer can be cured simultaneously thereby the production efficiency improves. Also, when carrying out the wire bonding, the adhesive layer is carried out with the pre-curing, thus the wire bonding can be carried out stably. Further, the adhesive layer is softened under the die bonding condition, thus it is embedded into the roughness of the chip mounting portion, and the void is prevented from being generated thus the package reliability increases.

The adhesive composition and the adhesive sheet of the present invention can be used for the adhering the semiconductor compound, glass, ceramics, metals or so in addition to the above mentioned method of use.

EXAMPLES

Hereinafter, the present invention will be explained using the examples; however the present invention is not to be limited thereto. Note that, in the below examples and the comparative examples, "the disperibility evaluation", "the embedding property into the circuit board", and "the package reliability evaluation" were carried out as following.

<The Dispersibility Evaluation>

The adhesive composition prepared in the examples and the comparative examples were coated on the releasing film so that the thickness is 20 μm, and the presence of the lines generated on the surface of the adhesive layer was verified by a visible observation. The lines are generated when the dispersibility of the filler is bad and aggregates.

<The Embedding Property Evaluation to the Circuit Board>

The adhesive composition prepared in the examples and the comparative examples were coated on the releasing film and dried so that the thickness after the drying is 20 μm, thereby the adhesive film was obtained. The glass chip (8 mm×8 mm the thickness of 150 μm) laminated with the adhesive film was pressed and bonded on the circuit board through the adhesive film under the condition of 150° C., 100 gf, 1 second. The circuit board (LN001E-001 PCB (Au) AUS303 made by CHINO GIKEN CORPORATION) used in the above has the circuit pattern which is formed on the copper foil (18 μm thickness) of copper clad laminates (CCL-HL830 made by MITSUBISHI GAS CHEMICAL COMPANY. INC), and has a solder resist (PSR-4000 AUS303 made by TAIYO INK MFG. CO. LTD) on said pattern. Then, by simulating the mold step, the heat pressure adhering was carried out by the heat seal tester (TP-701 made by TESTOR SANGYO CO., LTD) so that at the pressure of 6.9 Mpa, 175° C., for 2 minutes are applied to each chip. Then, by using the digital microscope (VHX-200 made by KEYENCE CORPORATION) at the magnification of 20× the upper face of the glass chip was observed and verified the embedding property. The embedding property was defined good when 95% or more of the chip area was embedded excluding the portion including the air layer such as void or so.

<The Package Reliability Evaluation>

(The Production of the Semiconductor Chip)

To the brushed face of the silicon wafer (diameter of 150 mm, thickness of 75 μm) finished with dry polishing, the lamination of the adhesive sheet of the examples and the comparative examples were carried out by the tape mounter (Adwill RAD 2500 made by Lintec Corporation) thereby it was fixed to the ring frame for wafer dicing. Then, by using the ultraviolet ray irradiation device (Adwill RAD2000 made be Lintec Corporation), the ultraviolet ray was irradiated (220 mW/cm$^2$, 160 mJ/cm$^2$) from the support face side. Next, by using the dicing device (DFD651 made by DISCO Corporation), the chip was diced into the size of 8 mm×8 mm. The cut during the dicing was made to cut 20 μm into the support.

(The Production of the Semiconductor Package)

As the circuit board, the circuit board comprising the circuit pattern formed on the copper foil (18 μm thickness) of the copper clad laminates (CCL-HL830 made by MITSUBISHI GAS CHEMICAL COMPANY. INC), and comprising a solder resist (PSR-4000 AUS303 made by TAIYO INK MFG. CO. LTD) on the pattern was used. The chip on the adhesive sheet obtained in the above was taken out together with the adhesive layer from the support, and pressure adhered on the circuit board at 120° C., 250 gf, for 0.5 second via the adhesive layer. Then, on to the adhered semiconductor chip, other semiconductor chip was pressure adhered again at 120° C., 250 gf, for 0.5 second via the adhesive layer thereby two semiconductor chips were stacked. Then, it was sealed (the sealing device MPC-06M TriAl Press made by APIC YAMADA CORPORATION) using the mold resin (KE-1100AS3 made by KYOCERA CHEMICAL CORPORATION) so that the sealed thickness is 400 μm, then the resin was cured at 175° C. for 5 hours. Then, the circuit board being sealed was laminated to the dicing tape (Adwill D-510T made by Lintec Corporation), and it was diced into the size of 8 mm×8 mm using the dicing device (DFD651 made by DISCO Corporation), thereby the semiconductor package for the reliability evaluation was obtained.

(The Evaluation)

The obtained semiconductor package was left for 120 hours at 60° C., the humidity of 60% RH and 85° C. and the humidity of 60% RH to allow absorbing the moisture, then IR reflow of heating time of 1 minute in which the preheat of −160° C. and the maximum temperature of 260° C. was carried out for three times; and the presence of the peeling at the connection part, the presence of the package crack was evaluated by a cross section observation using (VHX-100 made by KEYENCE CORPORATION) by grinding out the cross section using the scanning ultrasonic flow detection device (Hye-Focus made by Hitachi Construction Machinery Co., Ltd) and the cross section polishing machine (refine polisher HV made by Refinetec Corporation). When the peeling of 0.5 mm or longer was observed at the connection part of the semiconductor chip, it was determined as being peeled, and 27 packages were introduced into the test and the number of without a peel was counted.

<The Adhesive Composition>

Each component constituting the adhesive composition are shown in the following.
(A) The acrylic polymer: N-4617 (hydroxyl group containing) made by Nippon Synthetic Chemical Industry Co., Ltd.
(B) The heat curable resin:
(B-1) Acryloyl group added cresol novolac epoxy resins (CNA-147 made by NIPPON KAYAKU Co., Ltd.)
(B-2) The heat curing agent: aralkylphenol resin (MILEX XLC-4 made by MITSUI CHEMICALS, INC.)
(C) The coupling agent:
(C-1) Silane coupling agent comprising acryl group (KBM-5103 made by Shin-Etsu Co., Ltd.)
(C-2) Silane coupling agent comprising epoxy group (KBE-402 made by Shin-Etsu Co., Ltd.)
(C-3) Silane coupling agent comprising epoxy group (KBE-403 made by Shin-Etsu Co., Ltd.)
(C-4) Silane coupling agent comprising melcapto group (KBM-803 made by Shin-Etsu Co., Ltd.)

Note that, the used amount of the coupling agent was regulated so that the mol number of the methoxy group derived from the coupling agent included in the adhesive composition is approximately the same as that in the examples and the comparative examples.

(D) The photopolymerization initiator (IRGACURE 184 made by Ciba Speciality Chemicals)
(E) The curing accelerator: imidazol (Curezol 2PHZ made by SHIKOKU CHEMICALS CORPORATION.)
(F) The crosslinking agent: aromatic polyvalent isocyanate (CORONATE L made by NIPPON POLYURETHANE INDUSTRY Co., Ltd.)
(G) The filler: silicazol MEK-ST, the average filler particle diameter of 12 nm made by NISSAN CHEMICAL INDUSTRIES, LTD.)

The Examples and the Comparative Examples

The above mentioned components are blended in the amount (weight ratio) described in Table 1, and obtained the adhesive composition. By using the methylethyl ketone solution (the solid portion concentration of 30 wt %) of the obtained adhesive composition, the dispersibility was evaluated. The results are shown in Table 1. Also, the adhesive composition is coated and dried (drying condition: 100° C. for 1 minute in the oven) on the release treated face of the releasing film (SP-PET381031 made by Lintec Corporation) release treated with silicone so that the thickness after the drying is 20 μm; then it was laminated against the support (polyethylene film, the thickness of 100 μm, the surface tension of 33 mN/m); and the adhesive sheet was obtained by transferring the adhesive layer to the support. The semiconductor package was made using the obtained adhesive sheet, and the reliability was evaluated. The result is shown in Table 1. The PKG reliability in Table 1 refers to the package reliability, and in the above mentioned evaluation, it is shown as the number without a peel off/27 (the number of the package introduced in the test).

TABLE 1

| Component | Example 1 | Example 2 | Example 3 | Example 4 | Example 5 | Example 6 | Comparative example 1 | Comparative example 2 | Comparative example 3 |
|---|---|---|---|---|---|---|---|---|---|
| A | 100 | 100 | 100 | 100 | 100 | 100 | 100 | 100 | 100 |
| B-1 | 30 | 30 | 30 | 30 | 30 | 30 | 30 | 30 | 30 |
| B-2 | 6 | 6 | 6 | 6 | 6 | 6 | 6 | 6 | 6 |
| C-1 | 0.45 | 0.90 | 1.35 | 0.45 | 0.45 | 0.45 | | | |
| C-2 | | | | 0.75 | | | 0.72 | | |
| C-3 | | | | | | | | 0.53 | |
| C-4 | | | | | | | | | 0.38 |
| D | 1 | 1 | 1 | 1 | | 1 | 1 | 1 | 1 |
| E | 0.2 | 0.2 | 0.2 | 0.2 | 0.2 | 0.2 | 0.2 | 0.2 | 0.2 |
| F | 1.5 | 1.5 | 1.5 | 1.5 | 1.5 | 1.5 | 1.5 | 1.5 | 1.5 |
| G | | | | | | 15 | | | |
| Evaluation | | | | | | | | | |
| Dispersibility | good | good | good | good | good | good | good | good | good |
| Embedding property | good | good | good | good | good | good | good | good | good |
| PKG rliability (60° C., humidity 60% RH) | 27/27 | 27/27 | 27/27 | 27/27 | 27/27 | 27/27 | 0/27 | 16/27 | 0/27 |
| (85° C., humidity 60% RH) | 13/27 | 15/27 | 10/27 | 12/27 | 13/27 | 27/27 | 0/27 | 0/27 | 0/27 |

According to the above result, by employing the constitution of the present invention, the dispersibility of the coupling agent is improved, and the chips or the chip and the circuit board adheres against each other, thus the embedding property during the bonding is excellent, and the reliability of the semiconductor package can be maintained even when it is exposed to a high temperature during the wire bonding. Therefore, by providing the adhesive composition and the adhesive sheet according to the present invention, the production of the semiconductor package of the multistacking becomes easy and also the productivity improves.

The invention claimed is:

1. An adhesive composition comprising:
   an acrylic polymer (A),
   a heat curable resin (B), and
   a silane coupling agent (C) having a reactive double bond group selected from the group consisting of a (meth)acryl group, a vinyl group, a styryl group, and an allyl group,
   wherein the acrylic polymer (A) is included in a ratio of 50-90 wt. % in an entire weight of the adhesive composition and a weight average molecular weight of the acrylic polymer (A) is 100,000 to 2,000,000, and
   wherein the heat curable resin (B) comprises an epoxy resin and a heat curing agent, and at least one of the epoxy resin and the heat curing agent comprises an unsaturated hydrocarbon group.

2. The adhesive composition as set forth in claim 1 further comprising a filler (G).

3. A single layer adhesive film comprising the adhesive composition as set forth in claim 1.

4. An adhesive sheet wherein an adhesive layer comprising the adhesive composition as set forth in claim 1 is formed on a support.

5. The adhesive sheet as set forth in claim 4 wherein said support is a resin film.

6. The adhesive sheet as set forth in claim 4 wherein said support is a dicing sheet.

7. A production method of a semiconductor device comprising:
   laminating the adhesive layer of the adhesive sheet as set forth in claim 5 to a semiconductor wafer, dicing said semiconductor wafer and the adhesive layer, thereby obtaining a semiconductor chip,
   releasing the semiconductor chip from the support while the adhesive layer is transferred to said semiconductor chip, and
   adhering said semiconductor chip on a die pad portion or on other semiconductor chip via said adhesive layer.

8. The adhesive composition as forth in claim 1, wherein said unsaturated hydrocarbon group is selected from the group consisting of vinyl group, allyl group, acryloyl group, methacryloyl group, acrylamide group, and methacrylamide group.

9. An adhesive composition comprising:
   an acrylic polymer (A),
   a heat curable resin (B), and
   a silane coupling agent (C) having a reactive double bond group comprising a (meth)acryl group, a vinyl group, a styryl group, or an allyl group,
   wherein the acrylic polymer (A) is included in a ratio of 50-90 wt. % in an entire weight of the adhesive composition and a weight average molecular weight of the acrylic polymer (A) is 100,000 to 2,000,000, and
   wherein the heat curable resin (B) comprises an epoxy resin and a heat curing agent, and the heat curing agent comprises an unsaturated hydrocarbon group.

* * * * *